(12) United States Patent
Ishii et al.

(10) Patent No.: US 7,239,200 B2
(45) Date of Patent: Jul. 3, 2007

(54) POWER AMPLIFYING APPARATUS

(75) Inventors: Takuya Ishii, Osaka (JP); Masaharu Ikeda, Yokohama (JP); Hiroki Akashi, Hirakata (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 110 days.

(21) Appl. No.: 10/534,870

(22) PCT Filed: Nov. 6, 2003

(86) PCT No.: PCT/JP03/14135

§ 371 (c)(1),
(2), (4) Date: Sep. 19, 2005

(87) PCT Pub. No.: WO2004/047287

PCT Pub. Date: Jun. 3, 2004

(65) Prior Publication Data

US 2006/0132231 A1 Jun. 22, 2006

(30) Foreign Application Priority Data

Nov. 15, 2002 (JP) ............................. 2002-331898

(51) Int. Cl.
H03F 3/38 (2006.01)
(52) U.S. Cl. ...................... 330/10; 330/251; 330/207 A
(58) Field of Classification Search .................. 330/10, 330/207 A, 251
See application file for complete search history.

(56) References Cited

U.S. PATENT DOCUMENTS 4,737,731 A 4/1988 Swanson et al.

(Continued)

FOREIGN PATENT DOCUMENTS

EP 0 183 849 6/1986

(Continued)

OTHER PUBLICATIONS

K. P. Sozański et al., "Digital Control Circuit for Class-D Audio Power Amplifier", 32nd Annual IEEE Power Electronics Specialists Conference, PESC 2001, Conference Proceedings, Vancouver, Canada, Jun. 17-21, 2001, Annual Power Electronics Specialists Conference, New York, NY: IEEE, US, vol. 1 or 4, Conf. 32, Jun. 17, 2001, pp. 1245-1250.

(Continued)

*Primary Examiner*—Patricia Nguyen
(74) *Attorney, Agent, or Firm*—Wenderoth, Lind & Ponack, L.L.P.

(57) ABSTRACT

A power amplifying apparatus which is of a switching type and capable of efficiently amplifying a power of an input AC signal such as an acoustic signal, includes a first switch circuit (11) and a second switch circuit (12) to which a power supply voltage Vc is applied, an inductor (13) and a load (14) which are connected between the switch circuits, and a control circuit (15) which receives an input AC signal Vi, sets a predetermined ratio of ON/OFF periods, and drives the switch circuits. The control circuit (15) includes an arithmetic circuit (20) which multiplies a modulation sensitivity (for example, an amplitude of a triangular wave voltage used for generation of a pulse signal for driving a switch circuit) by a ratio (Vc/Ec) of the power supply voltage Vc and a DC component Ec thereof. This configuration can compensate for distortion caused by a ripple variation of the power supply voltage due to regenerated power or the like, and enable a gain control by the power supply voltage.

10 Claims, 8 Drawing Sheets

U.S. PATENT DOCUMENTS

| | | | |
|---|---|---|---|
| 4,820,940 A | 4/1989 | Wachi et al. | |
| 5,262,733 A | 11/1993 | Nakajima et al. | |
| 5,767,744 A * | 6/1998 | Irwin et al. | 330/297 |
| 5,777,519 A * | 7/1998 | Simopoulos | 330/297 |
| 5,898,340 A | 4/1999 | Chatterjee et al. | |
| 5,939,938 A * | 8/1999 | Kalb et al. | 330/51 |
| 6,331,801 B1 * | 12/2001 | Schmitt et al. | 330/10 |
| 2005/0002211 A1 * | 1/2005 | Lee et al. | 363/44 |

FOREIGN PATENT DOCUMENTS

| | | |
|---|---|---|
| EP | 0 503 571 | 9/1992 |
| JP | 54-80657 | 6/1979 |
| JP | 60-190010 | 9/1985 |
| JP | 61-39708 | 2/1986 |
| JP | 3-159409 | 7/1991 |
| JP | 4-281606 | 10/1992 |
| JP | 8-204466 | 8/1996 |
| JP | 2002-64983 | 2/2002 |
| WO | 03/061117 | 7/2003 |

OTHER PUBLICATIONS

K. Mark Smith et al., "Realization of a Digital PWM Power Amplifier using Noise and Ripple Shaping", Power Electronics Specialists Conference, 1995, PESC '95 Record, 26$^{th}$ Annual IEEE Atlanta, GA, USA Jun. 18-22, 1995, New York, NY, USA, IEEE, US, vol. 1, Jun. 18, 1995, pp. 96-102.

* cited by examiner $V_o = E_o \cdot \sin[\omega t]$ $I_o = \omega C_o E_o \cdot \cos[\omega t]$ $I_c = \dfrac{\omega C_o E_o^2}{2 V_c} \cdot \sin[2\omega t]$

POWER AMPLIFYING APPARATUS

TECHNICAL FIELD

The present invention relates to a power amplifying apparatus that amplifies the power of an input AC signal obtained from an acoustic signal to apply it to an electric acoustic converter such as a loudspeaker, and more particularly, to a compensation art for power supply voltage variation in a power amplifying apparatus having a D-class amplification function to an input AC signal.

BACKGROUND ART

In driving an acoustic speaker, a linear power amplifying apparatus such as an A-class, B-class, or AB-class amplifying apparatus having a simple configuration is used popularly. In such a linear power amplifying apparatus, a power loss of the power amplifying apparatus itself is large in an operational principle, and heat generated by a power consumption of the power amplifying apparatus itself increases according to an increase in output power. For this reason, a large heat sink to diffuse the heat is disadvantageously necessary. Therefore, as a power amplifying apparatus having a large output power, a switching power amplifying apparatus called a D-class power amplifying apparatus has been used.

A power amplifying apparatus having a D-class amplification function turns on or off an output power switch which supplies a power to switch a positive power supply voltage, a zero voltage, or a negative power supply voltage and to generate the switched voltage between output terminals. An inaudible high-frequency band power is removed by a power low-pass filter (LPF) arranged between the output terminals and a load to supply only an audible band power to the load. In a switch-on state, although a current flows, and an inter-terminal voltage is very small. In an off state, although a voltage is applied, a passing current is almost zero. For this reason, all power consumptions, which are products of the voltages and the currents, of the switches themselves are small.

In such a power amplifying apparatus, an output AC (alternate current) signal Vo varies due to a variation in power supply voltage. As a method of solving the problem, for example, there is a technique (for example, see Patent Document 1) that proportionates an amplitude Et of a triangular wave voltage Vt for pulse width modulation of a drive pulse for turning on or off a power switch to a supply voltage Vc. In addition, as conventional arts, there are patent documents 2, 3 and 4.

As a technique related to a power amplifying apparatus having a D-class amplification function, as shown in FIG. 6A, a power amplifying apparatus for driving loads in four switch circuits having an H-shaped bridge configuration, so-called a bridge-tied load (to be referred to as a "BTL" hereinafter) is generally known. The configuration and the operation of the power amplifying apparatus shown in FIG. 6A will be briefly described below.

A first switch circuit 11 to which a DC power supply 10 supplies a voltage Vc is composed of a first high-side switch 111 and a first low-side switch 112 which are n-channel MOSFETs. Similarly, a second switch circuit 12 is composed of a second high-side switch 121 and a second low-side switch 122 which are N-channel MOSFETs. An output terminal of the first switch circuit 11, i.e., a connection point between the first high-side switch 111 and the first low-side switch 112 is defined as a terminal X, and an output terminal of the second switch circuit 12, i.e., a connection point between the second high-side switch 121 and the second low-side switch 122 is defined as a terminal Y. A series circuit of an inductor 13 and a load 14 is connected between the terminal X and the terminal Y.

A control circuit 150 controls the first switch circuit 11 and the second switch circuit 12, and includes a pulse width modulation (PWM) circuit 40, a first drive circuit 51, and a second drive circuit 52. A signal source 16 outputs an input AC signal Vi.

The PWM circuit 40 converts the amplitude of an input AC signal Vi into a pulse width. An comparator 41 compares a triangular wave voltage Vt generated by a triangular wave generation circuit 300 with the input AC signal Vi to output the result as a signal M1. An inverter 42A inverts the signal M1 to output a signal M2.

The first drive circuit 51 includes an amplifier 511 which receives the signal M1 to drive the first high-side switch 111 and an inversion amplifier 512 which receives the signal M1 to drive the first low-side switch 112. The second drive circuit 52 includes an amplifier 521 which receives the signal M2 to drive the second high-side switch 121 and an inversion amplifier 522 which receives the signal M2 to drive the second low-side switch 122.

FIG. 6B is a timing chart of a conventional power amplifying apparatus constituted as described above.

As shown in FIG. 6B, a triangular wave voltage Vt increases and decreases between voltages ±Et having an amplitude Et in a cycle T. The cycle T is set to be sufficiently shorter than the change of the input DC signal Vi. The triangular wave voltage Vt and the input AC signal Vi are compared with each other by the comparator 41. An inverter 42 inverts the output signal M1 from the comparator 41 to generate a signal M2. The signal M1 goes to a high (H) level when the instantaneous value of the triangular wave voltage Vt is smaller than the instantaneous value of the input AC signal Vi, i.e., Vt(t)<Vi(t). A ratio δ (duty ratio) of the period in which the signal M1 is set at the H level to the cycle T is expressed by the following equation.

$$\delta = (1 + Vi/Et)/2 \qquad (1)$$

The first high-side switch 111 is turned on or off depending on the signal M1, and the first low-side switch 112 is turned on or off depending on the inverted signal of the signal M1. More specifically, the first high-side switch 111 and the first low-side switch 112 in the first switch circuit 11 are alternately turned on or off. On the other hand, the second high-side switch 121 is turned on or off depending on the signal M2, and the second low-side switch 122 is turned on or off depending on the inverted signal of the signal M2. More specifically, the second high-side switch 121 and the second low-side switch 122 in the second switch circuit 12 perform on/off operations opposite to those in the first switch circuit 11, respectively.

Therefore, in a period in which the signal M1 is set at H level, the terminal X has a voltage Vc which is a voltage at one end of the DC power supply 10, and the terminal Y has a voltage 0, i.e. zero potential, which is a voltage at the other terminal of the DC power supply 10. In a period in which the signal M1 is at a low (L) level, the terminal X has zero potential, and the terminal Y has the power supply voltage Vc. The above switching operation is repeated in the cycle T of the triangular wave voltage Vt. The cycle T is set to be so short that a variation of the input AC signal Vi can be neglected. Thus, an average potential Vx of a pulse voltage generated at the terminal X and an average potential Vy at the other terminal Y are expressed by using the duty ratio δ of the signal M1, the following equations can be obtained:

$$Vx = \delta Vc$$

$$Vy = (1\delta) Vc.$$

A smoothing function achieved by the inductor 13 generates a differential voltage between the average voltage Vx and the average voltage Vy across the terminals of the load 14. A voltage across the terminals, i.e., the output AC signal Vo is expressed by the following equation.

$$Vo = Vx - Vy = (2\delta - 1) Vc \quad (2)$$

Equation (1) is assigned to equation (2) to obtain $$Vo = (Vc/Et) \delta Vi \quad (3).$$

More specifically, the output AC signal Vo is equal to a voltage obtained by amplifying the input AC signal Vi, (Vc/Et) times.

In this manner, in the conventional technique shown in FIGS. 6A and 6B, the input AC signal Vi is modulated in pulse width by the PWM circuit 40 and amplified by an output section of the BTL, resulting in an overall gain of (Vc/Et). The value Et in equation (3) is a modulation sensitivity of a pulse modulation unit related to a part of the PWM circuit 40, and the value Vc is a gain element of the BTL output section.

A ripple variation caused by an output internal resistance when a large current is supplied to the load 14 or a ripple component remaining when a commercial power supply voltage is rectified is superposed on the voltage Vc of the DC power supply 10. In order to reduce the ripple variation or the ripple component, a circuit scale or a loss power has to be increased. In the configuration of the power amplifying apparatus in FIG. 6A, an amplification factor (Vc/Et) varies according to variation in Vc to increase level variation or distortion of the output AC signal Vo.

For improvement of the variation of the output AC signal Vo caused by the variation of the power supply voltage, for example, as disclosed in Patent Document 1, a technique that proportionates the amplitude Et of the triangular wave voltage Vt to the power supply voltage Vc is known. FIG. 7A shows a circuit diagram of a triangular wave generation circuit described in Patent Document 1 and an operation waveform chart of the circuit diagrams.

The configuration and the operation of the triangular wave generation circuit in FIG. 7A will be described below. In FIG. 7A, a terminal A1 is a terminal which receives a DC power supply voltage Vc, and is connected to a resistor R1. Alphabetical symbol "ADD" denotes an operational amplifier to which a resistor R2 and a resistor R3 are connected for providing an operation of an inverting amplifier. Alphabetical symbols "Cx" and "Cy" denote comparators. Alphabetical symbol "FF" denotes a flipflop. Alphabetical symbol "INT" denotes an operational amplifier to which a resistor R0 and a capacitor C0 are connected for providing an operation of an analog integrator. An output from the analog integrator INT is the triangular wave voltage Vt.

The gain of the operational amplifier ADD is sufficiently large and negative feedback is performed by the resistor R3, and thus the operational amplifier ADD operates such that a potential difference is rarely generated between the positive and negative input terminals. Hence the potential at a connection point G between the resistor R2 and the resistor R3 is a zero potential. Therefore, a potential Va2 at a connection point A2 between the resistor R1 and the resistor R2 is equal to a potential obtained by dividing the DC power supply voltage Vc by the resistor R1 and the resistor R2, and is expressed by the following equation.

$$Va2 = Vc \cdot R2/(R1+R2) \quad (4)$$

If resistances of the resistor R2 and the resistor R3 are equal to each other, a potential Va3 at an output terminal A3 of the operational amplifier ADD is a potential obtained by inverting the potential at the connection point A2 as expressed by the following equation.

$$Va3 = -Va2 = -Vc \cdot R2/(R1+R2) \quad (5)$$

On the other hand, in the operational amplifier INT, the flipflop FF is set. As shown by the broken line in FIG. 7B, when an output Q (voltage at a connection point A4) is a positive predetermined voltage (Vf), the voltage Vf is integrated. As a result, an output Vt linearly decreases. On the other hand, when the flipflop FF is reset and the connection point A4 is a negative predetermined voltage (−Vf), the output Vt linearly increases. It is noted that in this case, when the output Vt is equal to the voltage (Va2) at the connection point A2, the flipflop FF is set by the comparator Cx. When the output Vt is equal to the voltage (−Va2) at a connection point A3, the flipflop FF is reset by the comparator Cy. Therefore, the output Vt is a triangular voltage which varies between voltages ±Va2. As described in equations (4) and (5), the amplitude of the triangular wave voltage is proportional to the power supply voltage Vc.

The voltage Et of equation (3) is equal to the voltage Va2 expressed by equations (4) and (5). Thus, the voltages Va2 of the equation (4) and equation (5) is assigned to the voltage Et of equation (3) to obtain the following equation.

$$Vo = (Vc/Va2) \cdot Vi = (1+R1/R2) \cdot Vi \quad (6)$$

In this manner, when the amplitude of the triangular wave voltage Vt is made proportional to the power supply voltage Vc, the amplification factor of the D-class power amplifying apparatus can be made constant without being affected by the power supply voltage Vc.

<Patent Documents>
Patent Document 1: JP,54-80657,A (see FIG. 4)
Patent Document 2: JP,60-190010,A
Patent Document 3: JP,2002-64983,A
Patent Document 4: JP,61-39708,A
Patent Document 5: JP,3-159409,A

DISCLOSURE OF THE INVENTION (Problem to be Solved by the Invention)

As described above, in the power amplifying apparatus having a conventional D-class amplification function having the configuration shown in FIG. 7A, a change in gain caused by the voltage Vc of the BTL output unit is compensated for by the amplitude of the triangular wave voltage Vt which determines the gain of the pulse modulation unit. More specifically, the amplitude of the triangular wave voltage Vt is proportionated to the power supply voltage Vc, so that the gain of the power amplifying apparatus is made constant without being affected by the power supply voltage Vc.

On the other hand, there is another method of using equation (3) different from the method of the objects of the conventional art. This method gives attention to the fact that the output AC signal Vo is proportional to the power supply voltage Vc, and uses the fact for volume control or the like. When a volume is lowered, the following measurement is generally used. That is, the amplitude of the input AC signal Vi is reduced, or the modulation sensitivity of the pulse modulation unit is reduced.

However, in this case, first, the pulse modulation becomes shallow, and a signal/noise ratio decreases, or a resolution decreases in a digital system. Secondly, since a switching loss in the D-class amplifier depends on the number of times of switching, a switching loss does not decrease even though an output level decreases. The power conversion efficiency cannot be improved when the output is lowered.

As the third problem except for the volume, the following problem is posed. When a load which accumulate and discharge energy, i.e., a motor, an electrodynamic acoustic speaker, a piezoelectric actuator, an inductive coil, or the like is driven, the discharge energy is reversely flowed (regenerated) from the output circuit of the D-class amplifier to the power supply unit. For this reason, stabilizing control of the power supply unit is disturbed, or a power consumption increases due to disposition of the returned power.

The problem to be solved by the application is to suppress rapid variation, i.e., distortion of an output level by a variation in power supply voltage which is a problem of the conventional art while solving the first and second problems by operating the power supply voltage, and also to improve the influence by the regenerated power in the third problem.

More specifically, in the conventional power amplification apparatus shown in FIG. 6A, the output AC signal Vo, as expressed by equation (3), is proportional to a product of the power supply voltage Vc and the input AC signal Vi. For example, when the load 14 is a loudspeaker, in order to suppress the volume the loudspeaker, i.e., in order to decrease the output AC signal Vo, the power supply voltage Vc is decreased, or the input AC signal Vi is decreased. In considering both cases, a power consumption is smaller in the case in which the power supply voltage Vc is decreased. This is because when the input AC signal Vi is decreased, only the duty ratio δ approximates to 50%, however, when the power supply voltage Vc is decreased, a voltage applied to the series circuit of the inductor 13 and the load 14 decreases, and an effective value of the flowing current also decreases. This tendency is more conspicuous when the load 14 is capacitive such as a piezoelectric speaker, inductivity such as an inductor, or an electro-mechanical conversion system such as a loudspeaker or a motor. This will be described below.

For example, when the DC power supply 10 of the conventional power amplifying apparatus shown in FIG. 6A is realized by a step-up converter 100, i.e., when the voltage of the battery is stepped up and converted by the step-up converter 100 to supply the output as the power supply voltage Vc, a ripple voltage is included in the power supply voltage Vc to cause the output AC signal Vo to be disturbed.

The step-up converter 100 includes an inductor 102 to which power is supplied from a buttery 101, a switch 103, a diode 104, a capacitor 105, and a control circuit 106. The power supply voltage Vc is divisionally detected by a variable resistor pair 107. The ON/OFF ratio of the switch 103 is controlled to stabilize the detected voltages. Therefore, the step-up converter 100 can control an output voltage from the capacitor 105, i.e., the power supply voltage Vc through the variable resistor pair 107. In the D-class power amplifying apparatus having such a configuration, for descriptive convenience, the load 14 is handled as a capacitive load and the electrostatic capacitor is handled as Co.

In the D-class power amplifying apparatus configured as shown in FIG. 8, operation waveforms of the respective nodes are shown in FIGS. 9A to 9C. As shown in FIG. 9A, a sine-wave voltage with an amplitude Eo is supposed as the output AC signal Vo as expressed below.

$$Vo = Eo \cdot \sin[\omega t]$$

At this time, as shown in FIG. 9B, an average current Io flowing in the load 14 is expressed below:

$$Io = Co \cdot dVo/dt = \omega \cdot Co \cdot Eo \cdot \cos[\omega t]$$

When the current Io flows in a switch circuit having an H-shaped bridge configuration, a current Ic supplied from a power supply is as shown in FIG. 9C. In the capacitor 105, not only a discharge current but also a charge current having the same quantity as that of the discharge current flow. The step-up converter 100 can handle the discharge current from the capacitor 105 as an output current, but cannot handle the discharge current, resulting in increase of the power supply voltage Vc. As a result, a ripple voltage generated by regenerated power is included in the power supply voltage Vc to distort the output AC signal Vo.

As a technique that compensates the variation of the output AC signal Vo caused by the variation of the power supply voltage Vc, in addition to Patent Document 1, as disclosed in the publication of Patent Document 2 or Patent Document 3, a method of changing the amplitude of the triangular voltage depending on a variation in power supply voltage is known. In any case, the amplitude of the triangular wave voltage is proportionated to the voltage of the power supply.

In Patent Document 4 or Patent Document 5, the variation in power supply voltage is fed back not to the amplitude of the triangular wave voltage but to the setting of the pulse width of a pulse signal. However, these documents do not disclose a function that uses the power supply voltage for gain control.

It is an object of the present invention to provide a power amplifying apparatus that compensates for ripple which is a rapid variation in the power supply voltage Vc which causes distortion of an output AC signal. In particular, when a load which regenerates power is driven, the power amplifying apparatus achieve compensation for the ripple of the power supply voltage caused by the regenerated power without increasing the power consumption of the power amplifying apparatus. In addition, the power amplifying apparatus controls the power supply voltage to make it possible to control a gain while suppressing power loss.

(Solving Methods)

In the first aspect of the present invention, a power amplifying apparatus having the following configuration is provided. The power amplifying apparatus includes a switch unit that is supplied with a power supply voltage Vc and includes a series circuit of a high-side switch and a low-side switch, and a control unit that operates the switch unit in accordance with the input AC signal Vi in a cycle with a predetermined ratio of ON and OFF periods to drive a load connected to a connection point between the high-side switch and the low-side switch. The control unit includes a pulse modulation unit that receives the input AC signal Vi, generates a pulse signal from the input AC signal Vi at a predetermined modulation sensitivity, and outputs the pulse signal, an arithmetic unit that detects a DC voltage component (Ec) from the power supply voltage Vc, and that multiplies the modulation sensitivity by a ratio (Vc/Ec) of the power supply voltage (Vc) to the DC component (Ec) or multiplies the input AC signal Vi by a ratio (Ec/Vc) of the DC component (Ec) to the power supply voltage (Vc), and a drive unit that drives the switch unit on the basis of the pulse signal.

In the second aspect of the present invention, there is provided a power amplifying apparatus in which a switch is driven by a pulse signal generated by modulating an input AC current signal at a modulation sensitivity multiplied by the ratio (Vc/Ec) of a power supply voltage Vc to a DC voltage component Ec of the supplied power supply voltage Vc.

In the third aspect of the present invention, there is provided a power amplifying apparatus in which a switch is driven by a pulse signal which depends on an input AC signal multiplied by a ratio (Ec/Vc) of a DC voltage component Ec of a power supply voltage Vc to the supplied power supply voltage Vc.

As another aspect of the present invention, a power amplifying apparatus may include the following configuration. The power amplifying apparatus includes a switch unit that includes a series circuit of a high-side switch and a low-side switch, a load being connected to a connection point between the high-side switch and a low-side switch, a power supply unit that supplies a power supply voltage (Vc) to the switch unit, a pulse modulation unit that converts an input signal (Vi) into a pulse signal at a predetermined modulation sensitivity and outputs a drive signal to the switch unit, and an arithmetic unit that proportionates the modulation sensitivity to the power supply voltage (Vc). The power amplifying apparatus detects a DC voltage component (Ec) from the power supply voltage (Vc) and uses the DC voltage component as a negative feedback signal for stabilizing an output of the power supply unit.

(Effect More Advantageously than Prior Art)

According to the present invention, even though the power supply voltage Vc alternately varies, the gain of the power amplifying apparatus is not adversely affected, and the output AC signal can be advantageously prevented from being distorted by the variation of the power supply voltage Vc. The decrease in gain by a DC voltage component Ec of the power supply voltage can reduce the effective values of currents flowing in the switch circuits that drive the load in the power amplifying apparatus, and the power consumption can be advantageously reduced. The DC voltage component Ec of the power supply voltage Vc in the switch circuit constituted by the series circuit of the high-side switch and the low-side switch is varied, and thus the gain of the power amplifying apparatus can be adjusted efficiently.

In addition, when a power is supplied through a stabilizing power supply unit, a detection voltage which is fed back to stabilize the output voltage is limited to the DC component thus to stabilize only the DC component of the power supply voltage but not to stabilize a component in an AC signal band. Hence, ripple of the power supply voltage caused by a regenerated power which is generated when a load with regeneration of power is driven and which appears in the power supply unit is not absorbed, and the power can be recycled. Accordingly, as a whole, a power consumption can be considerably reduced.

BEST MODE FOR CARRYING OUT THE INVENTION

A power amplifying apparatus according to the present invention will be described below by preferred embodiments with reference to the accompanying drawings.

First Embodiment

Figure 1A:
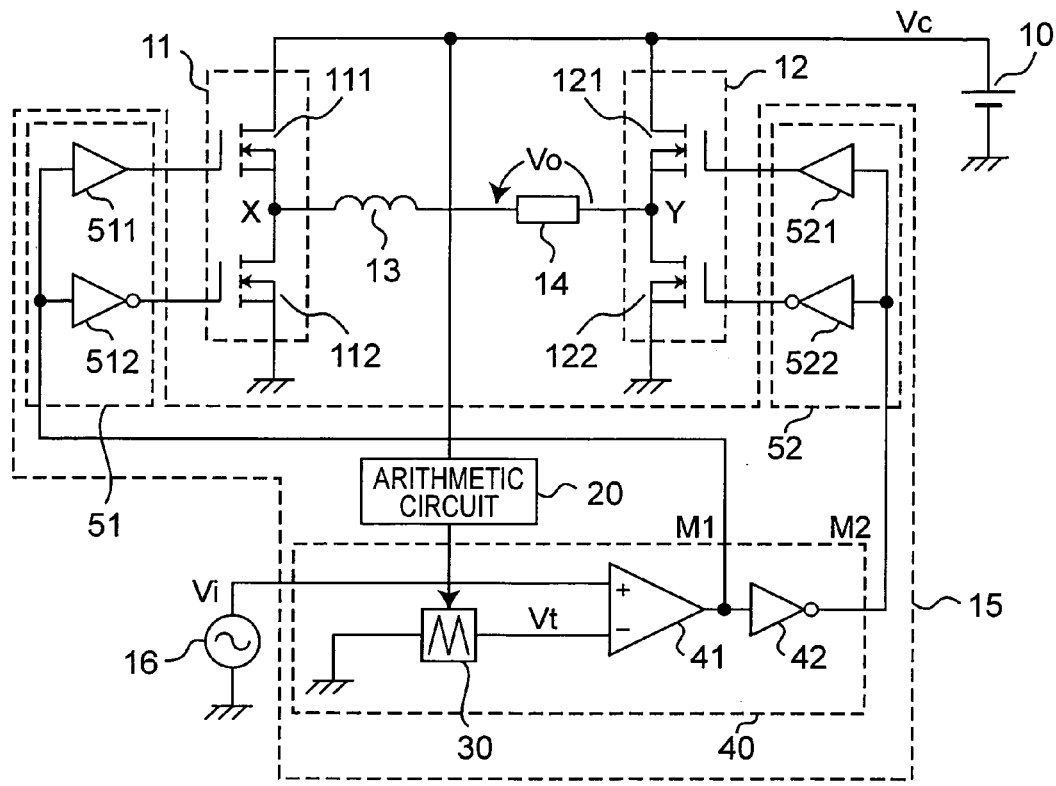
FIG. 1A is a circuit diagram of a power amplifying apparatus according to the first embodiment of the present invention.

FIG. 1A shows a circuit configuration of a power amplifying apparatus according to the first embodiment.

The power amplifying apparatus includes first and second switch circuits 11 and 12 and a control circuit 15 that controls the operations of these switch circuits. The control circuit 15 has first and second drive circuits 51 and 52 that drive the first and second switch circuits 11 and 12, respectively, an arithmetic circuit 20 that detects a power supply voltage Vc to output a predetermined voltage, and a pulse width control circuit 40.

The first switch circuit 11 receives a power supply voltage Vc from a DC power supply 10 and includes a first high-side switch 111 and a first low-side switch 112 that are N-channel MOSFETs on one side of an H-shaped bridge configuration switch circuit. Similarly, the second switch circuit 12 includes a second high-side switch 121 and a second low-side switch 122 that are N-channel MOSFETs. A series circuit of an inductor 13 and a load 14 is connected between an output terminal of the first switch circuit 11, that is, a connection point X between the first high-side switch 111 and the first low-side switch 112, and an output terminal of the second switch circuit 12, that is, a connection point Y between the second high-side switch 121 and the second low-side switch 122. A signal source 16 is a source that generates an input AC signal Vi.

The configuration of this embodiment is different from the conventional art in that the control circuit 15 includes an arithmetic circuit 20 and a triangular wave voltage generation circuit 30 that generates a triangular wave voltage Vt having an amplitude which is provided by an output voltage of the arithmetic circuit 20.

Figure 1B:
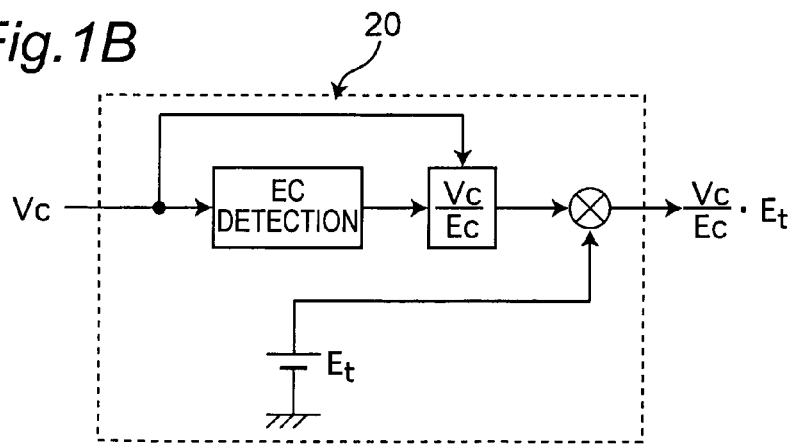
FIG. 1B is a circuit diagram of an arithmetic circuit according to the first embodiment of the present invention.

The arithmetic circuit 20, as shown in FIG. 1B, detects a DC (direct current) voltage component Ec from the power supply voltage Vc, multiplies a reference amplitude (predetermined voltage Et) of a triangular wave signal from the triangular wave voltage generation circuit 30 by a ratio (Vc/Ec) between the DC voltage component Ec and the power supply voltage Vc, and outputs the obtained amplitude.

The pulse width control circuit (PWM circuit) 40 converts the amplitude of the input AC signal Vi into a pulse width. The PWM circuit 40 compares the triangular wave voltage Vt generated by the triangular wave voltage generation circuit 30 with the input AC signal Vi by a comparator 41, outputs the comparison result as a signal M1, and outputs a signal M2 obtained by inverting the signal M1 by an inverter 42.

The first drive circuit 51 includes an amplifier 511 which receives the signal M1 to drive the first high-side switch 111, and an inversion amplifier 512 which receives the signal M1 to drive the first low-side switch 112. The second drive circuit 52 includes an amplifier 521 which receives the signal M2 to drive the second high-side switch 121 and an inversion amplifier 522 which receives the signal M2 to drive the second low-side switch 122.

An operation of the power amplifying apparatus according to the first embodiment will be described below.

An amplitude Vtc of the triangular wave voltage Vt is obtained by causing the arithmetic circuit 20 to multiply the ratio (Vc/Ec) between the power supply voltage Vc and the DC voltage component Ec thereof by the predetermined voltage Et, and is expressed by the following equation.

$$Vtc = (Vc/Ec) \cdot Et \tag{7}$$

In this manner, in the embodiment, the value of the amplitude Vtc of the triangular wave voltage Vt is used as a value obtained by multiplying the predetermined voltage Et by the ratio (Vc/Ec) of the power supply voltage Vc and the DC component Ec thereof. In this case, the predetermined voltage Et is a reference voltage for generating an amplitude voltage of a triangular wave voltage which is not demodulated, and is a modulation sensitivity in amplitude control of a triangular wave. More specifically, equation (7) means that the modulation sensitivity is multiplied by the ratio (Vc/Ec) between the power supply voltage Vc and the DC component Ec thereof.

The input AC signal Vi and the triangular wave voltage Vt are compared with each other by the comparator 41. An output from the comparator 41 is a signal M1. An inverted signal M2 of the signal M1 is output from the inverter 42. The signal M1 goes to the H level when the triangular wave voltage Vt is smaller than the instantaneous value of the input AC signal Vi, i.e., Vt(t)<Vi(t) is satisfied. A ratio (duty ratio) δ of the period in which the signal M1 is set at the H level to the cycle T is expressed by the following equation.

$$\delta = (1 + Vi/Vtc)/2 \tag{8}$$

In the first switch circuit 11, the first high-side switch 111 is turned on or off depending on the signal M1, while the first low-side switch 112 is turned on or off depending on the inverted signal of the signal M1. Thus, the first high-side switch 111 and the first low-side switch 112 are alternately turned on or off. On the other hand, in the second switch circuit 12, the second high-side switch 121 is turned on or off depending on the signal M2, while the second low-side switch 122 is turned on or off depending on the inverted signal of the signal M2. Thus, the second high-side switch 121 and the second low-side switch 122 perform on/off operations opposite to those in the first switch circuit 11, respectively.

Therefore, during a period in which the signal M1 is at H level, the power supply voltage Vc is applied to the output terminal x and the output terminal y has zero potential. On the other hand, during a period in which the signal M1 is at L level, the output terminal x has zero potential, and the power supply voltage Vc is applied to the output terminal y. The above switching operation is repeated in the cycle T of the triangular wave voltage Vt. The cycle T is set to be so short that a variation of the input AC signal Vi can be neglected.

An average potential Vx of one output terminal x and an average potential Vy of the other output terminal y are expressed as follows, using the duty ratio δ of the signal M1, respectively.

$$Vx = \delta \cdot Vc, \quad Vy = (1-\delta) \cdot Vc$$

A smoothing operation achieved by the inductor 13 generates a differential voltage between the average voltage Vx and the average voltage Vy across the terminals of the load 14. A voltage across the terminals, i.e., the output AC signal Vo is expressed by equation (2) described in the "Background Art":

$$Vo = Vx - Vy = (2\delta - 1) \cdot Vc \tag{2}$$

Equation (8) is assigned to equation (2) to provide the following equation.

$$Vo = (Vc/Vtc) \cdot Vi \tag{9}$$

Further equation (7) is assigned to equation (9) to provide the following equation.

$$Vo = (Ec/Et) \cdot Vi \tag{10}$$

According to the equation (10), the gain of the power amplifying apparatus is a ratio (Ec/Et) between the power supply voltage Vc and the predetermined amplitude Et of the triangular wave signal. Hence, even though the power supply voltage Vc varies, if the DC voltage component Ec does not vary, the output AC signal Vo is not affected. In this manner, in the configuration of this embodiment, a mechanism such as a low-pass filter (LPF) that discriminates a DC component from the power supply voltage Vc is arranged to narrow a frequency band which compensates for the variation of the power supply voltage to a signal band of a ripple component or the like. Thus the variation of the DC voltage component Ec, i.e., a variable gain is permitted while distortion of the output AC signal Vo caused by an AC variable component of the power supply voltage Vc is compensated.

Therefore, the power amplifying apparatus according to the embodiment varies the DC voltage component Ec of the power supply voltage Vc applied to the switch circuit of the H-shaped bridge configuration, and thus it is possible to control the gain of the power amplifying apparatus. In this manner, even though the power supply voltage Vc of the DC power supply 10 alternately varies due to a current supplied to the load 14 or a regenerated current from the load 14, the gain can be increased or decreased while compensating distortion of the output AC signal Vo caused by the alternate variation of the power supply voltage Vc.

Second Embodiment

Figure 2:
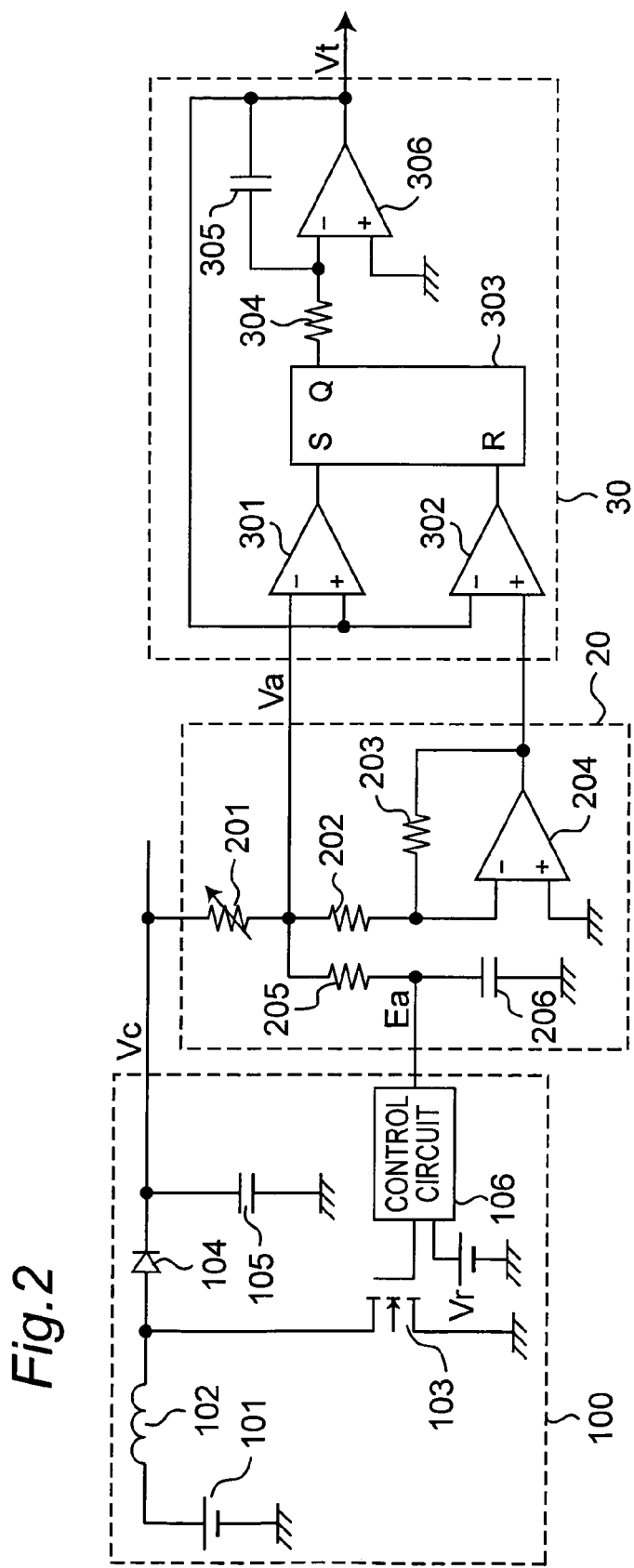
FIG. 2 is a circuit diagram of a main part of a power amplifying apparatus according to the second embodiment of the present invention.
Figure 6A:
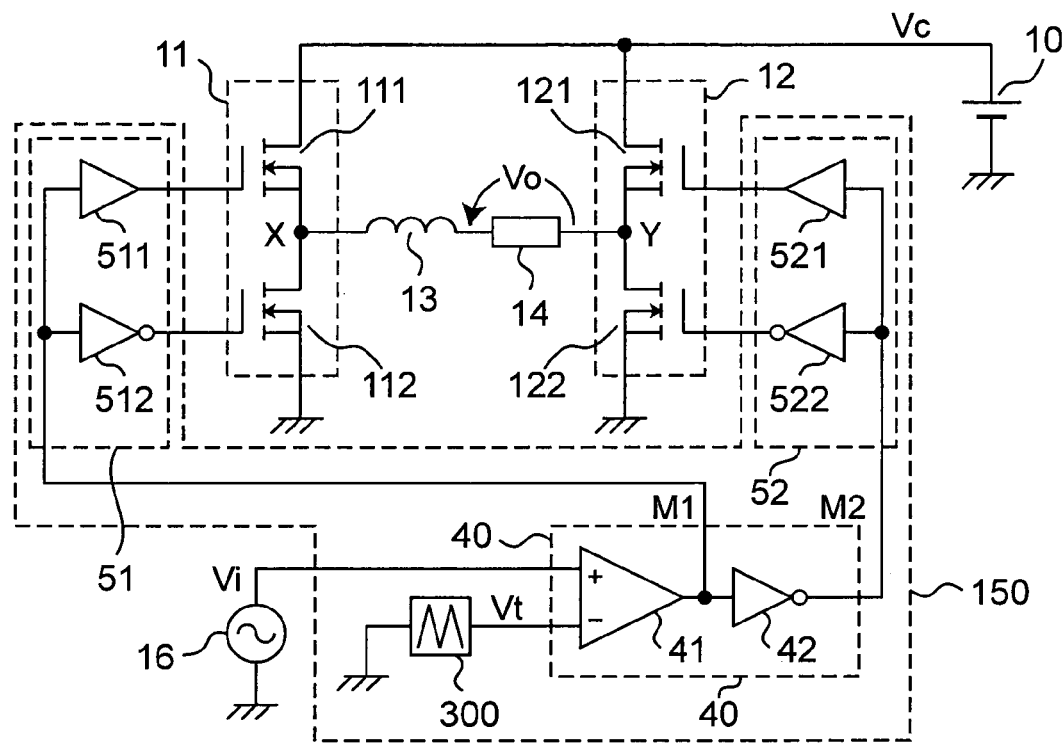
FIG. 6A is a circuit diagram of a conventional power amplifying apparatus.
Figure 6B:
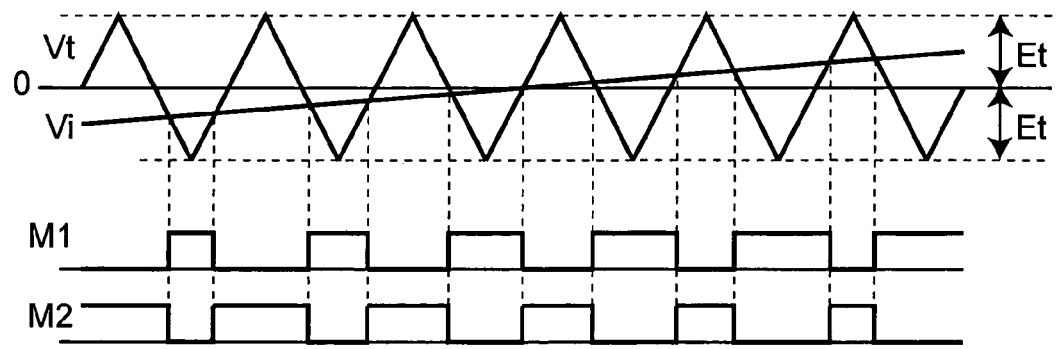
FIG. 6B is an output characteristic diagram of a triangular wave generation circuit and a PWM circuit in the power amplifying apparatus in FIG. 6A.
Figure 7A:
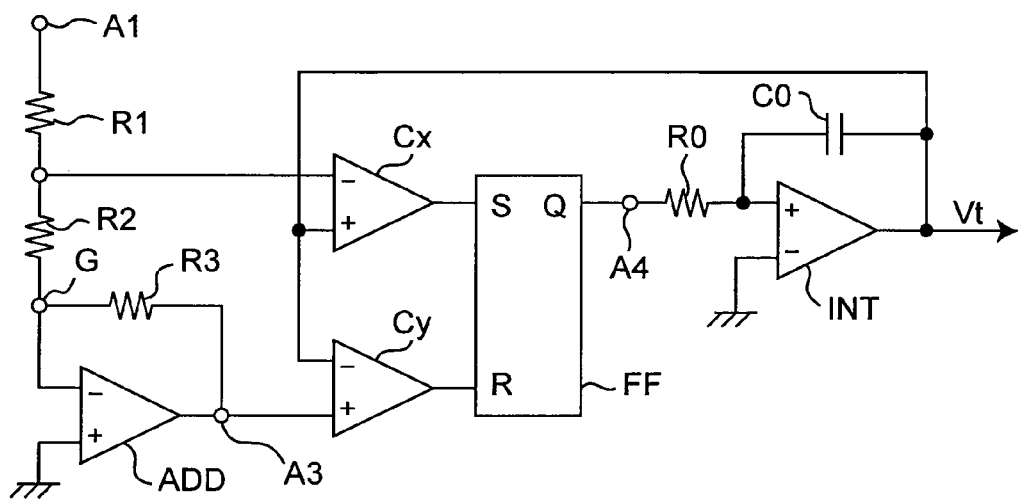
FIG. 7A is a circuit diagram of a conventional power amplifying apparatus.
Figure 7B:
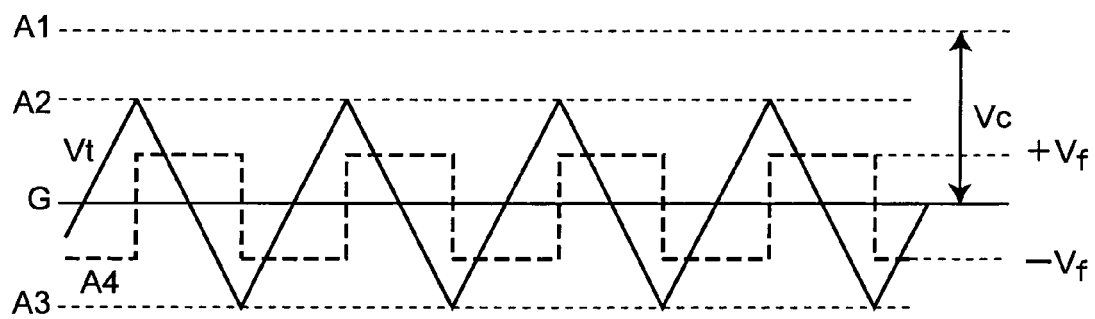
FIG. 7B is an output characteristic diagram of the power amplifying apparatus in FIG. 7A.
Figure 8:
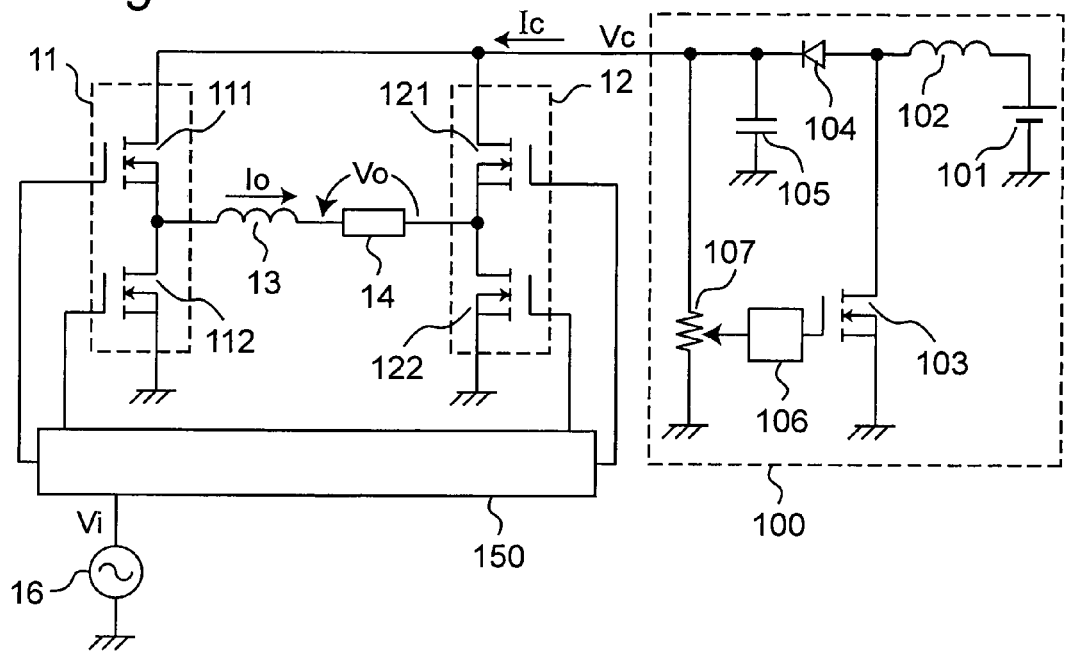
FIG. 8 is a circuit diagram of a conventional power amplifying apparatus.
Figure 9A:
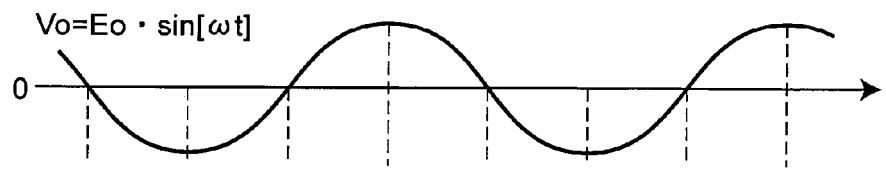
FIG. 9A is a graph showing an output voltage waveform (Vo) of the power amplifying apparatus in FIG. 8.
Figure 9B:
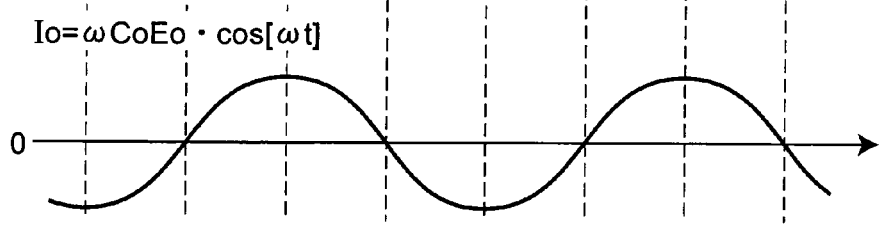
FIG. 9B is a graph showing an output current waveform (Io) of the power amplifying apparatus in FIG. 8.
Figure 9C:
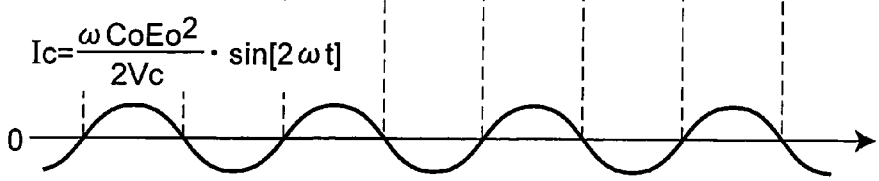
FIG. 9C is a graph showing a power supply current waveform (Ic) of the power amplifying apparatus in FIG. 8.

FIG. 2 shows the circuit configuration of a main part of a power amplifying apparatus according to the second embodiment. The same reference numerals as in the power amplifying apparatus of the first embodiment shown in FIG. 1 denote the same elements in FIG. 2. Furthermore, since the drive circuits 51 and 52, the switch circuits 11 and 12 of the H-shaped bridge configuration, the load 14, and the like are substantially the same as those in FIG. 1, these elements are omitted. The configuration in FIG. 2 is different form that in FIG. 1 in that a DC-DC step-up converter (DC-DC converter) 100 which is arranged in place of the DC power supply 10 steps up and converts a voltage of a buttery 101 to supply a power supply voltage Vc. Further configurations of the arithmetic circuit 20 and the triangular wave voltage generation circuit 30 are described in detail. In addition, control of the amplitude of a triangular wave of the triangular wave voltage generation circuit 30 through the arithmetic circuit 20 is the same as that in the conventional power amplifying apparatus as shown in FIGS. 6B, 7A, and 7B. More specifically, by the control, the maximum amplitude of the triangular wave voltage is proportionated to the power supply voltage Vc, thereby compensating a variation in modulation sensitivity of a pulse modulation unit based on a DC band.

An operation of the power amplifying apparatus according to the embodiment will be described below.

The step-up converter 100 includes a series circuit of an inductor 102 and a switch 103 connected to the buttery 101 in parallel to each other, a series circuit of a diode 104 and a capacitor 105 connected to the switch 103 in parallel, and a control circuit 106 that drives the switch 103 at a predetermined ON/OFF ratio. The control circuit 106 receives a reference voltage Vr and controls on/off operation of the switch 103 such that a power supply voltage Vc is equal to the reference voltage Vr. The step-up converter 100 accumulates magnetic energy in the inductor 102 by on operation of the switch 103 and discharges the magnetic energy of the inductor 102 to the capacitor 105 by off operation of the switch 103 through the diode 104. The voltage of the capacitor 105 is applied as the power supply voltage Vc of the H-shaped bridge configuration switch circuit.

The arithmetic circuit 20 includes a series circuit of a variable resistor 201 and a resistor 202 which receives the voltage Vc from the capacitor 105, an operational amplifier 204 to which the resistor 203 is feedback-connected and which operates as an inversion amplifier, and a low-pass filter including a resistor 205 and a capacitor 206 that averages a connection point potential between the variable resistor 201 and the resistor 202 to output a DC component Ea.

It is assumed that the variable resistor 201 has a resistance (VR) and that the resistor 202 and the resistor 203 have the same resistance value (R20). The operational amplifier 204 has a sufficiently large gain and negatively fed back by the resistor 203, and thus the operational amplifier 204 operates such that a potential difference between the positive and negative input terminals is almost zero. Hence, the connection point potential between the resistor 202 and the resistor 203 is zero potential (ground potential). Therefore, the connection point potential Va between the variable resistor 201 and the resistor 202 is a value obtained by dividing the power supply voltage Vc by the variable resistor 201 and the resistor 202, and is expressed by the following equation.

$$Va = Vc \cdot R20/(VR+R20) \quad (11)$$

Since the connection point potential between the resistor 202 and the resistor 203 is zero potential and the resistor 202 and the resistor 203 have the equal resistance (R20), the potential of the output terminal of the operational amplifier 204 is (−Va).

On the other hand, the low-pass filter having the resistor 205 and the capacitor 206 averages a connection point potential Va between the variable resistor 201 and the resistor 202 to output a DC component Ea of the connection point potential Va which is supplied to the control circuit 106 in the step-up converter 100. The DC component Ea of the connection point potential Va between the variable resistor 201 and the resistor 202 is proportional to the DC voltage component Ec of the power supply voltage Vc, and is expressed by the following equation.

$$Ea = Ec \cdot R20/(VR+R20) \quad (12)$$

The step-up converter 100 performs negative feedback control such that the value of the DC component Ea of the connection point potential Va obtained by dividing the output voltage Vc and removing the ripple component from the output voltage Vc is equal to an internal reference voltage Vr, and induces the value of the DC component Ea to the output voltage Vc such that the value of Ea in equation (12) is Vr. In general, the negative feedback in the stabilizing power supply circuit including the step-up converter does not include a low-pass filter because a band to be stabilized is made wide. However, in this application, the path of the negative feedback includes a low-pass filter (205 and 206) to narrow the band to be stabilized to a DC band, so that negative feedback is not applied to the band of a amplified signal. In the power supply voltage Vc at the band which is not applied with the negative feedback, ripple caused by a variation in load increases. The increase in ripple is handled by the distortion compensation described above.

Va is given from equations (11) and (12) as follows.

$$Va = (Vc/Ec) \cdot Ea \quad (13)$$

In the above equation, as will be described later, reference symbol "Va" denotes a voltage which provides the amplitude of a triangular wave generated by the triangular wave voltage generation circuit 30. Reference symbol "Ea" denotes a voltage which provides a reference of the amplitude of the triangular wave. In this case, when it is assumed that the voltage Ea is a modulation sensitivity in amplitude control of the triangular wave, equation (13) means that the modulation sensitivity is multiplied by a voltage ratio (Vc/Ec). Va may denote a modulation sensitivity in the amplitude control of the triangular wave. In this case, the modulation sensitivity should be proportionated to the power supply voltage Vc.

The triangular wave voltage generation circuit 30 includes two comparators 301 and 302, a flipflop 303, and an operational amplifier 306 to which a resistor 304 and a capacitor 305 are connected to operate as analog integrator. An output from the operational amplifier 306 is a triangular wave voltage Vt. When the flipflop 303 is set and outputs a predetermined positive voltage, the integrator including the operational amplifier 306 or the like integrates the voltage. As a result, the output Vt linearly decreases. In contrast to this, when the flipflop 303 is reset and outputs a predetermined negative voltage, the output Vt linearly increases. During the increase of the output Vt, when the output Vt exceeds a connection point potential (+Va) between the variable resistor 201 and the resistor 202, the flipflop 303 is set by the comparator 301, and then the output Vt begins to decrease. When the output Vt becomes not larger than a potential (−Va) of the output terminal of the amplifier 204, the flipflop 303 is reset by the comparator 302.

Therefore, the output Vt is a triangular wave voltage which varies between the two potentials (±Va). As expressed in equation (11), the amplitude of the triangular wave voltage is proportional to the power supply voltage Vc. The triangular wave voltage Vt and the input AC signal Vi are compared with each other by the comparator 41, as in the first embodiment, a ratio (duty ratio) δ of the period in which the signal M1 is at H level in the cycle T is expressed by the following equation.

$$\delta = (1 + Vi/Va)/2 \quad (14)$$

Furthermore, as in the first embodiment, the output AC signal Vo is expressed by the following equation, using the duty ratio δ and the power supply voltage Vc.

$$Vo = (2\delta - 1) \cdot Vc \quad (15)$$

Equation (14) is assigned to equation (15) to obtain the following equation.

$$Vo = (Vc/Va) \cdot Vi \quad (16)$$

Equation (13) is assigned to equation (16) to obtain the following equation.

$$Vo = (Ec/Ea) \cdot Vi \quad (17)$$

Hence, the output AC signal Vo is equal to a voltage obtained by amplifying the input AC signal Vi, (Ec/Ea) times.

As is apparent from equation (17), the gain of the power amplifying apparatus according to the embodiment is expressed by a ratio (Ec/Ea) between the DC voltage component Ec of the power supply voltage Vc of the H-shaped bridge configuration switch circuit and the DC voltage Ea which is a detection voltage of the step-up converter 100. Even though the power supply voltage Vc varies, if the DC voltage Ea does not vary, the output AC voltage Vo is not affected. In this manner, in the configuration of this embodiment, a mechanism that discriminates a DC component from the power supply voltage Vc is arranged to narrow a frequency band which compensates for the variation of the power supply voltage to a signal band of a ripple component or the like, so that variation of a DC component is allowed.

As is apparent from equation (12), the step-up converter 100 operates such that the DC voltage Ea is stabilized depending on the reference voltage Vr. On the other hand, by the resistance VR of the variable resistor 201, the DC component Ec of the power supply voltage Vc of the H-shaped bridge configuration switch circuit is variable. In the embodiment, a low-pass filter is arranged on a negative feedback path to narrow a band to be stabilized to a DC band and not to apply negative feedback to the band of the amplified signal. In the power amplifying apparatus according to the embodiment, the gain (Ec/Ea) can be controlled by the variable resistor 201. In addition, even though the power supply voltage Vc which is the terminal voltage of the capacitor 105 in the step-up converter 100 alternately varies due to a current supplied to the load 14 or a regenerated current from the load 14, the gain of the power amplifying apparatus is not affected, and the output AC signal Vo is not distorted. Furthermore, for the step-up converter 100, since the variation of the power supply voltage Vc by the current supplied to the load 14 and the regenerated current from the load 14 is permitted, power consumed in power supply control can be reduced.

When the output AC signal Vo is desired to be decreased, the DC component Ec in the power supply voltage Vc is decreased. In this manner, an effective value of a current flowing in both the pair of switch circuits of the H-shaped bridge configuration can be decreased, and an output from the step-up converter 100 can also be suppressed, and thus an advantage that a power consumption can be considerably reduced as a whole can be obtained.

Third Embodiment

Figure 3:
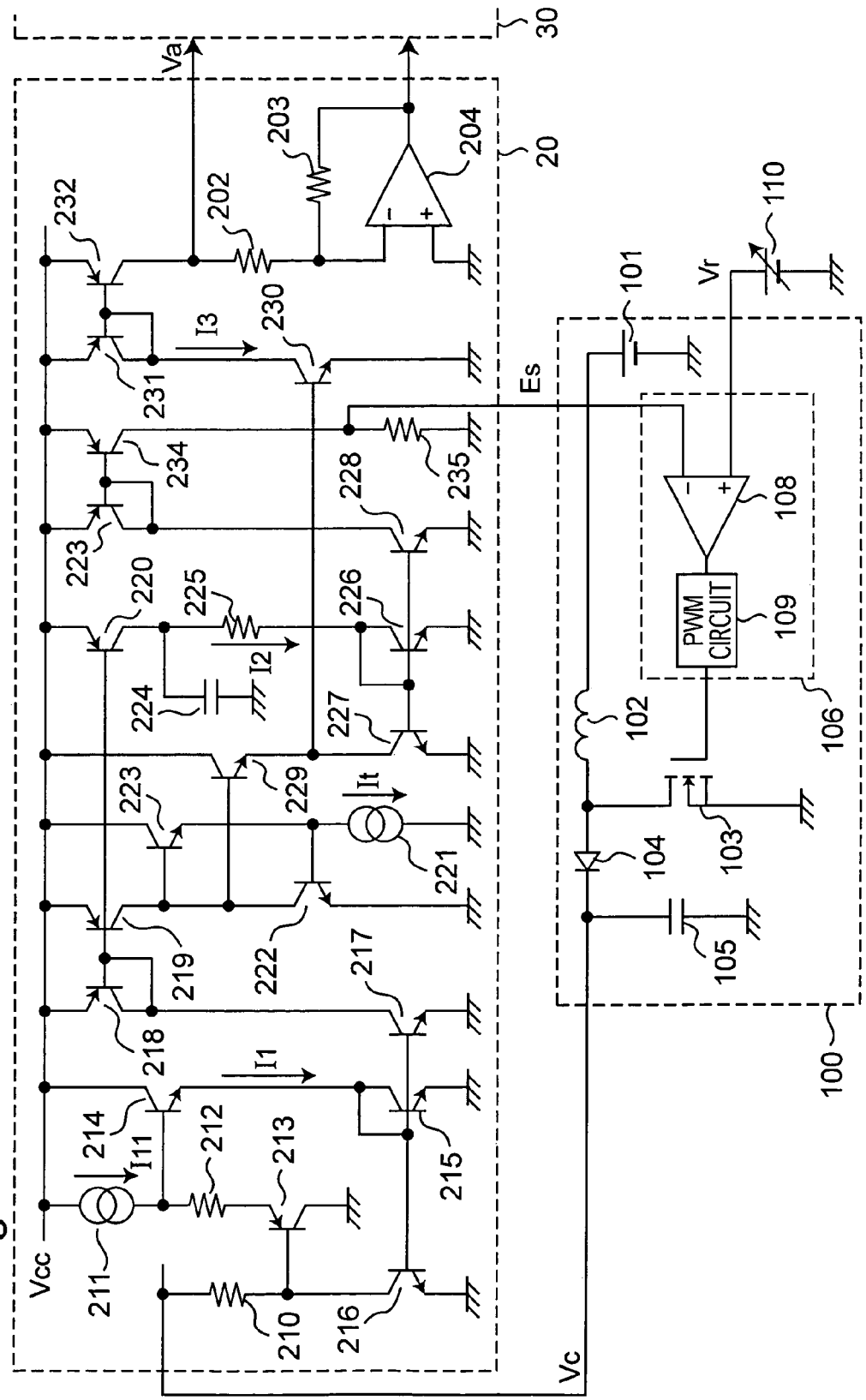
FIG. 3 is a circuit diagram of a main part of a power amplifying apparatus according to the third embodiment of the present invention.

FIG. 3 shows the circuit configuration of a main part of the power amplifying apparatus according to the third embodiment. The same reference numerals as in the power amplifying apparatus of the second embodiment shown in FIG. 2 denote the same constituent elements in FIG. 3. The circuit configuration following a triangular wave voltage generation circuit 30 may be the same as that in FIG. 2. Furthermore, the configuration including a drive circuit, an H-shaped bridge configuration switch circuit, a load unit, and the like which follow a PWM circuit 40 may also be the same substantially as that in FIG. 1. Hence these components are omitted in the drawing. The circuit configuration in FIG. 3 is different from the circuit configuration in FIG. 2 in the internal configuration of an arithmetic circuit 20.

An operation of the power amplifying apparatus according to the embodiment shown in FIG. 3 will be described below.

In a step-up converter 100, a series circuit of an inductor 102 and a switch 103 is connected between both terminals of a buttery 101, and a series circuit of a diode 104 and a capacitor 105 is connected to the switch 103 in parallel.

The step-up converter 100 accumulates magnetic energy in the inductor 102 by an on operation of the switch 103 and discharges the magnetic energy of the inductor 102 to the capacitor 105 by an off operation of the switch 103 through the diode 104. An inter-terminal potential of the capacitor 105 is output as a power supply voltage Vc of the H-shaped bridge configuration switch circuit.

The switch 103 is driven by a control circuit 106 at a predetermined ON/OFF ratio. The control circuit 106 has an error amplifier 108 and a PWM circuit 109. The error amplifier 108 receives a detection voltage Es at a negative input terminal, and receives a predetermined reference voltage Vr at a positive input terminal from a voltage source 110. The control circuit 106 controls on/off operation of the switch 103 such that the detection voltage Es is equal to the reference voltage Vr.

The arithmetic circuit 20 includes an amplifying circuit having a resistor 210 that detects the power supply voltage Vc, a constant current source 211 for a current value (I11), a resistor 212 and a PNP transistor 213 in which the current (I11) by the constant current source 211 flows, an NPN transistor 214 that has a base terminal connected to the connection point between the constant current source 211 and the resistor 212 and supplies a first current (current value I1), an NPN transistor 215 which a first current (current value I1) is supplied to and has a diode-connection, and a pair of NPN transistors 216 and 217 which are coupled to the NPN transistor 215 with a current mirror configuration.

More specifically, when the power supply voltage Vc increases, a base potential of the transistor 213 increases through the resistor 210 and an emitter potential also increases. Similarly, an emitter potential of the transistor 214 having the emitter terminal connected to that node also increases. However, since the emitter terminal is grounded through the transistor 215 with diode-connection, the increase in potential is small and a collector current increases. The transistor 215 serves as an input of the current mirror. An increase of the collector current of the transistor 215 appears as an increase of the collector current of the transistor 216. This causes a current flowing in the resistor 210 to increase, thereby increasing a voltage drop of the resistor to suppress an increase of a base potential of the transistor 213. In this manner, the negative feedback operation is conducted.

In this manner, the base terminal of the PNP transistor 213 is operationally a virtual ground point of the amplifying circuit. When the gain of the amplifying circuit is increased, the potential of the base terminal is almost unvaried. Therefore, the function of the resistor 210 is to divide the potential difference between the power supply voltage Vc serving as an input and the virtual ground potential by the resistance of the resistor 210 to convert the potential difference into a current.

The resistance of the resistor 210 is represented by Rs, and the resistance of the resistor 212 is represented by R212. Base-emitter voltages of the transistors is represented by adding the last 2 digits of reference numeral of each transistor to the symbol Vbe. The potential of the base terminal of the PNP transistor 213 is given by $$Vbe15+Vbe14-I11\cdot R212-Vbe13.$$

On the other hand, this voltage is also expressed from a voltage drop in the resistor 210 by a current (equivalent to the first current I1) flowing in the transistor 216, by $$Vc-I1\cdot Rs.$$

Since the respective base-emitter voltages are almost equal to each other, these voltages are represented by Vbe. In this case, the first current I1 can be approximately expressed by the following equation.

$$I1=(Vc-Vbe+I11\cdot R212)/Rs$$

If $I21\cdot R212 \approx Vbe$ is satisfied, the following expression can be obtained.

$$I1 \approx Vc/Rs \tag{18}.$$

The first current I1 becomes almost proportional to the power supply voltage Vc.

The arithmetic circuit 20 has PNP transistors 218, 219, and 220 connected in a current mirror configuration which receives the first current I1 and re-supplies the first current I1, a constant current source 221, and an NPN transistor 222 having a base terminal connected to the constant current source 221. In addition, the collector terminal of the NPN transistor 222 is connected to the collector terminal of the transistor 219 and also connected to the base terminals of a NPN transistor 223 and an NPN transistor 229. The base terminal of the NPN transistor 222 and the constant current source 221 are connected to the emitter of the NPN transistor 223 to flow a constant current It in the emitter. In this configuration, when a current flowing in a node of the base terminal of the NPN transistor 223 increases, the node potential increases, and the emitter potential of the NPN transistor 223 and the base potential of the NPN transistor 222 are increased. At this time, the collector current in the NPN transistor 222 increases, thereby suppressing an increase of a flowing current of the node of the base terminal of the first NPN transistor 223. Finally, the flowing current balances at a point where the flowing current is almost equal to the collector current of the transistor 222, and is stable at the base potential of the transistor 223 depending on the current flowing in the node.

In the arithmetic circuit 20, a collector terminal of the PNP transistor 220 is connected to a capacitor 224, and also connected to an NPN transistor 226 which is diode-connected through a resistor 225. The collector current of the PNP transistors 220 is a current I1 obtained by dividing the power supply voltage Vc by Rs of the resistor 210. The current I1 is converted into a voltage by the resistor 225 and the dynamic resistance of the diode-connected transistor 226. Since the variable components of the current I1 flows in the capacitor 224 by a roundabout path, a current I2 having a smoothed DC component flows in the diode-connected transistor 226. Since the collector terminal of the NPN transistor 226 serves as an input terminal of the current mirror circuit, the currents I2 having DC components appear at collector terminals of an NPN transistor 227 and an NPN transistor 228. The collector terminal of the NPN transistor 227 is connected to the emitter terminal of the NPN transistor 229, so that the current I2 serves as an emitter current of the transistor 229. The emitter terminal of the transistor 229 is also connected to the base terminal of an NPN transistor 230. The collector terminal of the NPN transistor 230 is connected to a PNP transistor 231 serving as an input of the diode-connected current mirror, and a current I3 as a collector current of the NPN transistor 230 flows in the collector terminal. The current I3, as the output of the current mirror, appearing at the collector terminal of a PNP transistor 232 is led to an inversion amplifier including the resistor 202, the resistor 203, and the operational amplifier 204 which are the same as those in the arithmetic circuit 20 of the second embodiment in FIG. 2.

An operation of the arithmetic circuit 20 will be described below. A base-emitter voltage Vbe22 of the NPN transistor 222 in which the first current I1 proportional to the power supply voltage Vc flows is expressed by the following equation.

$$Vbe22=(k\cdot T/q)\cdot \ln(I1/Is) \tag{19}$$

where k: Boltzmann constant, T: absolute temperature, q: electronic charge, Is: reverse saturation current of base/emitter/diode.

Similarly, a base-emitter voltage Vbe23 of the NPN transistor 223 in which the current It of the constant current source 221 flows as a collector current, and a base-emitter voltage Vbe29 of the NPN transistor 229 in which the second current I2 serving as the DC component of the first current I1 flows as a collector current are expressed by the following equations, respectively.

$$Vbe23=(k\cdot T/q)\cdot \ln(It/Is) \tag{20}$$

$$Vbe29=(k\cdot T/q)\cdot \ln(I2/Is) \tag{21}$$

Furthermore, since the third current I3 flows as the collector current of the NPN transistor 230, the base-emitter voltage Vbe30 of the NPN transistor 230 is expressed by the following equation.

$$Vbe30=(k\cdot T/q)\cdot \ln(I3/Is) \tag{22}$$

In this case, the potential of the node of the base terminal of the transistor 223 in which the current I1 obtained by dividing the power supply voltage Vc by Rs of the resistor 210 can be expressed by the following equation (23) in the circuit configuration. More specifically, with respect to the left-hand side, the emitter terminal of the NPN transistor 222 is grounded, and the emitter terminal of the NPN transistor 223 is connected to the base terminal of the NPN transistor 222, so that the potential of the base terminal is equal to a potential obtained by serially connecting the base-emitter voltages of both the transistors. In a similar way, with respect to the right-hand side, it is equal to a potential obtained by serially connecting the base-emitter voltages of the NPN transistor 230 and the NPN transistor 229. As is apparent from the above principle of operation, the potential of the node of the base terminal of the transistor 223 is determined by the current I1 and the current It on the left-side hand. As a result, depending on this operation, the current I3 is generated in the right-side hand. Therefore, the following equation is obtained.

$$Vbe22+Vbe23=Vbe29+Vbe30 \qquad (23)$$

When the respective equations (19) to (22) are assigned to the equation (23), the third current I3 is obtained as follows.

$$I3=I1 \cdot It/I2=(I1/I2) \cdot It \qquad (24)$$

The first current I1 is proportional to the power supply voltage Vc and the second current I2 is a DC component of the first current I1. With the DC component in the power supply voltage Vc represented by Ec, the following equations are satisfied.

$$I2=Ec/Rs$$

$$I1/I2=Vc/Ec$$

Using the relationship between the power supply voltage Vc and the DC component Ec, the third current I3 is expressed by the following equation.

$$I3=(Vc/Ec) \cdot It \qquad (25)$$

The third current I3 flows in the resistor 202 by the current mirror constituted by the PNP transistor 231 and the PNP transistor 232. Since the operational amplifier 204 constituting the inversion amplifier together with the resistor 202 and the resistor 203 has a sufficiently large gain, a connection point potential between the resistor 202 and the resistor 203 is zero potential. Therefore, using the resistance of the resistor 202 represented by R20, a voltage drop component (potential difference) Va of the resistor 202 is expressed by the following equation.

$$Va=I3 \cdot R20=(Vc/Ec) \cdot It \cdot R20 \qquad (26)$$

In this case, (It·R20) is a voltage which gives a reference voltage of the amplitude of a triangular wave generated by the triangular wave voltage generation circuit 30, i.e., a modulation sensitivity. Therefore, equation (26) means that the modulation sensitivity is multiplied by the voltage ratio (Vc/Ec). The voltage Va is a signal voltage input to the triangular wave voltage generation circuit 30 (see FIG. 2).

The potential of the output terminal of the operational amplifier 204 is (−Va) with the resistances of the resistor 202 and the resistor 203 set to be equal to each other. The voltage expressed by the following equation is supplied to the triangular wave voltage generation circuit 30.

$$\pm Va=\pm(Vc/Ec) \cdot It \cdot R20.$$

As an output signal from the triangular wave voltage generation circuit 30, a triangular wave voltage Vt which is oscillated between the potential (+Va) and the potential (−Va) is generated.

The third embodiment is obtained by combining the first embodiment and the second embodiment. The triangular wave voltage Vt and the input AC signal Vi, as shown in FIG. 2 of the second embodiment, are compared with each other by the comparator 41. A ratio (duty ratio) δ of the period in which the signal M1 is set at H level to the cycle T is expressed by the following equation.

$$\delta=(1+Vi/Va)/2 \qquad (14).$$

The output AC signal Vo is expressed by the following equation by using the duty ratio δ and the power supply voltage Vc.

$$Vo=(2\delta-1) \cdot Vc \qquad (15)$$

When equation (14) is assigned to equation (15), as in the first embodiment, the following equation is obtained:

$$Vo=(Vc/Va) \cdot Vi \qquad (16).$$

When equation (26) is assigned to equation (16), the following equation.

$$Vo=(Ec/(It \cdot R20)) \cdot Vi \qquad (27).$$

More specifically, the output AC signal Vo is equal to a voltage obtained by amplifying the input AC signal Vi (Ec/(It·R20)) times.

In this embodiment, in the arithmetic circuit 20, a PNP transistor 233 which serves as an input of a current mirror and which is diode-connected is connected to the collector terminal of the NPN transistor 228, and a current I2 serving as the collector current of the NPN transistor 228 flows. Thus a current I2 as a DC component of a current I1 obtained by dividing the power supply voltage Vc by Rs of the resistor 210 is output from the collector of a PNP transistor 234 serving as the output of the current mirror, and the current I2 flows in a resistor 235. Using the resistance of the resistor 235 represented by R35, a voltage Es generated by the resistor 235 is expressed by the following equation.

$$Es=Ec \cdot (R35/Rs) \qquad (28).$$

The voltage Es is applied to the negative input terminal of the error amplifier 108 of the step-up converter 100. As in FIG. 2 of the second embodiment, the step-up converter 100 is operated by the control circuit 106 such that the detection voltage Es is equal to the reference voltage Vr, and thus the DC component Ec in the power supply voltage Vc which is an output voltage from the step-up converter 100 is expressed by the following equation.

$$Ec=Vr \cdot (Rs/R35) \qquad (29)$$

The gain of the power amplifying apparatus according to the embodiment, as expressed in equation (27), is expressed by (Ec/(It·R20)) obtained using the DC component Ec in the power supply voltage Vc of the H-shaped bridge configuration switch circuit, the constant current It, and the resistance R20.

Therefore, the step-up converter 100 makes the reference voltage Vr and the resistance R20 of the resistor 202 variable to vary the DC component Ec in the power supply voltage Vc of the H bridge variable. As a result, the gain of the power amplifying apparatus according to the embodiment can be controlled. Furthermore, even though the power supply voltage Vc which is the voltage across the capacitor 105 in the step-up converter 100 alternately varies due to a current supplied to the load 14 or a regenerated current from the load 14, the gain of the power amplifying apparatus is not affected and the output AC signal Vo is not distorted.

With the above configuration, a gain control can be achieved by the power supply voltage Vc. When the power supply voltage Vc is decreased to decrease the gain, the effective value of a current flowing in the H-shaped bridge configuration switch circuit can be decreased, and the step-up converter can suppress it's output. Hence, the power consumption can be considerably reduced as a whole.

In the power amplifying apparatus described in the second embodiment, the power supply voltage Vc is detected by a dividing means constituted by a plurality of resistors including a variable resistor, and the triangular wave voltage Vt is generated by the dividing means. Then the triangular wave voltage Vt is used as a detection signal for the negative feedback control of a power supply unit which performs control for stabilizing the power supply voltage Vc through a low-pass filter. Thus, the DC component Ec in the power supply voltage Vc cannot be made smaller than the DC component Et of the amplitude of the triangular wave voltage Vt even though the resistance VR of the variable resistor 201 is minimized, i.e., zero. In contrast to this, in the power amplifying apparatus according to the present embodiment, the arithmetic circuit 20 independently obtains the triangular wave voltage Vt from the power supply voltage Vc and outputs a DC component Ec in the power supply voltage Vc in a divided voltage form through a low-pass filter. The output voltage is compared with the reference voltage Vr by the step-up converter, so that the DC component Ec in the power supply voltage Vc is controlled. Thus, the DC component Ec in the power supply voltage Vc can be theoretically controlled to an arbitrary voltage which is larger than zero.

Figure 4A:
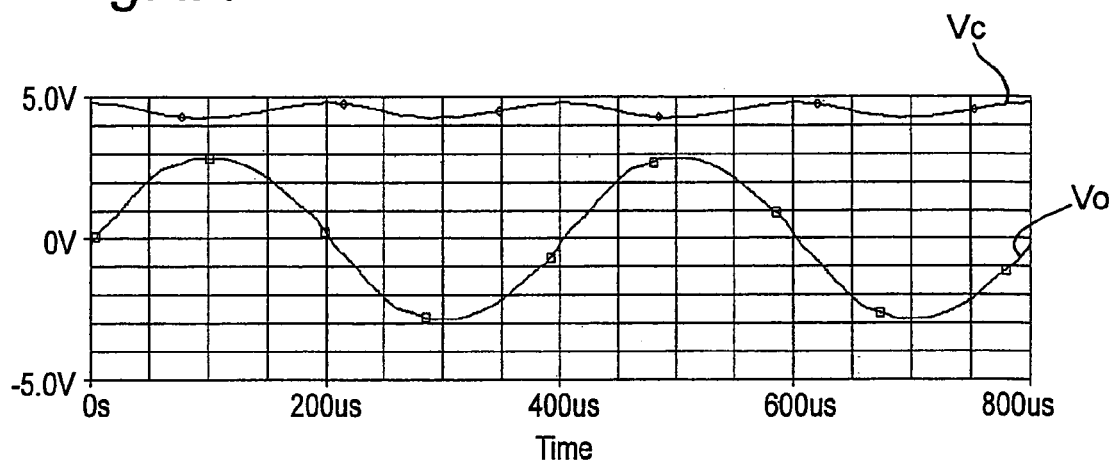
FIG. 4A is an operational simulation characteristic diagram of an output AC signal waveform of a conventional power amplifying apparatus.
Figure 4B:
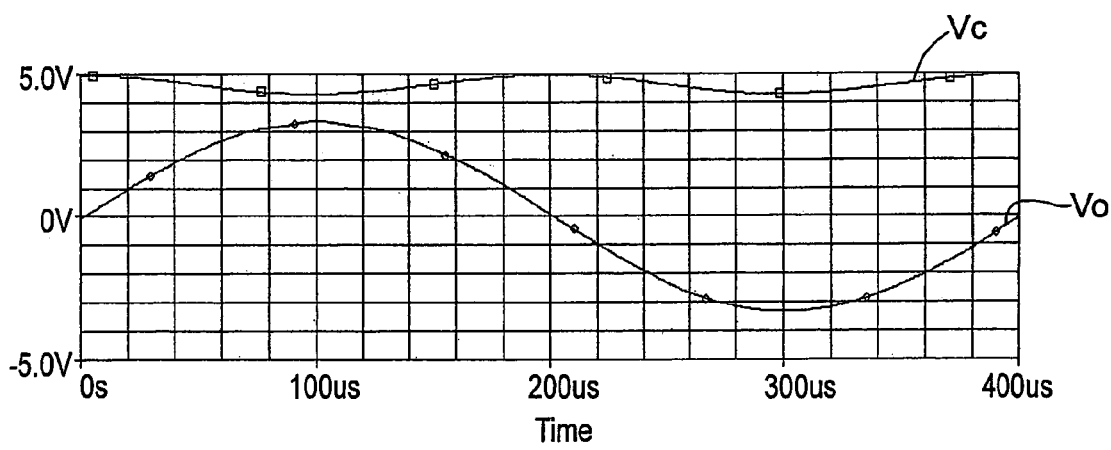
FIG. 4B is an operational simulation characteristic diagram of an output AC signal waveform obtained by a power supply voltage variation compensation operation in the power amplifying apparatus according to the present invention.

FIGS. 4A and 4B are characteristic diagrams obtained by simulating an effect of distortion compensation for the output AC signal Vo by the variation of the power supply voltage Vc in the power amplifying apparatus of the present embodiment.

In FIG. 4A, from a constant voltage source having a voltage of 5 V, through a diode and a resistor having a resistance of 100 Ω, a capacitor having a capacitance of 0.47 μF is used as a power supply. This configuration simulates a general stabilizing power supply with a power flow which is a one-way flow from the input to the output. FIG. 4B shows waveforms of the power supply voltage Vc and the output AC signal Vo under the following conditions. The condition is that a capacitor having a capacitance of 0.27 μF is used as a load, the input AC signal Vi is a sine-wave voltage having an effective value of 0.7 V (vrms) at 2.5 kHz, and the triangular wave voltage Vt has an amplitude of 1 V at 250 kHz. A variation of about 0.5 V (Vpp) is generated as a peek-to-peek voltage in the power supply voltage Vc. Thus, the output AC signal Vo had a distortion rate of 4.2%. FIG. 4B shows the characteristics with the same input conditions as those in FIG. 4A. However, FIG. 4B shows a waveform of the power supply voltage Vc and the output AC signal Vo when the distortion compensation is applied by the power amplifying apparatus according to the present embodiment. Although a variation of about 0.7 V (Vpp) is generated in the power supply voltage Vc, the distortion rate with respect to the output AC signal Vo is improved to 1.0% or less.

Regarding the first to third embodiments, in the first embodiment, in a distortion compensation operation for a variation of the power supply voltage Vc, a band subjected to distortion compensation is set to be a band of an AC signal by using two signals, i.e., the power supply voltage Vc and the DC component thereof, and a frequency band lower than the band is used in a power supply voltage operation for increasing/decreasing the gain of the power amplifying apparatus.

In the second embodiment, the power amplifying apparatus further includes a stabilizing power supply that generates the power supply voltage Vc, applies a negative feedback for stabilizing control to only a DC component to weaken the stabilizing control in an AC signal band. In this manner, when a load with regeneration is driven, regenerated power is temporarily accumulated in the output of the power supply unit while preventing disturbance caused by power returning to the power supply unit, thereby improving the efficiency. In addition, these operations are operated in conjunction with each other to enable the gain control.

The third embodiment is obtained by combining the second embodiment and the first embodiment. In the third embodiment, negative feedback to the power supply unit of the power supply voltage Vc for stabilizing control is limited to only a DC component. Thus an advantage is obtained when a load with regeneration is driven. In a distortion compensation operation, distortion compensation is applied to an AC signal band by using two signals including the power supply voltage Vc and the DC component Ec thereof, and the lower band is used for a gain control of the power amplifying apparatus. In particular, in the third embodiment, the DC component Ec obtained by removing an AC component from the power supply voltage Vc, and a negative feedback signal for stabilizing control of the power supply unit are generated by the same LPF. Thus, a boundary frequency which allows the power supply unit to vary due to regenerated power becomes equal to a boundary frequency of distortion compensation performed by a variation of the power supply voltage Vc of the pulse modulation unit. The gain control of the amplifying apparatus can be conveniently performed at the boundary frequency or less. These boundary frequencies may be arbitrarily set so that compensation for distortion due to the variation of the power supply voltage and a band subjected to stabilization of the power supply voltage are appropriate. It is apparent in principle of operation that the boundary frequencies are not limited to the values described above.

(Modifications)

Each of the first to third embodiments explains an example in which the power supply voltage compensation is performed such that the amplitude Vtc of the triangular wave voltage Vt is provided as follows.

$$Vtc = (Vc/Ec) \cdot Ea \text{ or}$$

$$Vtc = (Vc/Ec) \cdot Et$$

However, when the amplitude Vtc of the triangular wave voltage Vt is fixed and the input AC signal Vi is multiplied by a ratio (Ec/Vc), the same effect as described above can be obtained. More specifically, equation (9) is multiplied by the voltage ratio (Ec/Vc), the following equation is obtained.

$$Vo = (Vc/Vtc) \cdot Vi \cdot (Ec/Vc)$$
$$= (Ec/Vtc) \cdot Vi$$

According to the above equation, it can be understood that the gain can be controlled by the DC component Ec of the power supply voltage Vc while removing a variation of the power supply voltage Vc from the output AC signal Vo. The input AC signal may be a current.

In the above embodiment, although the explanation is made by giving attention to a modulation sensitivity in amplitude control of a triangular wave, the modulation sensitivity is not limited to the modulation sensitivity described above. More specifically, when considering the amplitude control of the triangular wave as modulation, it is understood that the control of the amplitude of the triangular wave is equal to increasing/decreasing a modulation sensitivity. Therefore, the idea of the present invention in which the DC component Ec is extracted from the power supply voltage Vc and the modulation sensitivity (amplitude) is multiplied by a ratio (Vc/Ec) can be widely applied to a power amplifying apparatus in which the relationship between input and output signals satisfies the following relationship and which has a modulation sensitivity "A".

$$Vo=(Vc/A) \cdot Vi \quad (30)$$

In addition, the present invention can also be applied to a case in which the dimensions of the input and the output are different from each other. For example, it can be applied to a case in which an input AC signal is not a voltage as expressed by the following equation but a current Ii.

$$Vo=(Vc/A) \cdot Ii \quad (31)$$

As described above, the idea of the present invention in which the DC component Ec is extracted from the power supply voltage Vc and the modulation sensitivity is multiplied by (Vc/Ec) or an input AC signal Vi is multiplied by (Ec/Vc) can be widely applied to a power amplifying apparatus in which the relationship between the input and output signals is expressed by equations (30) and (31). For example, when Vi in equation (30) is multiplied by the ratio (Ec/Vc), the following equation is obtained.

$$Vo = (Vc/A) \cdot Vi \cdot (Ec/Vc) \quad (32)$$
$$= (Ec/A) \cdot Vi$$

Figure 5:
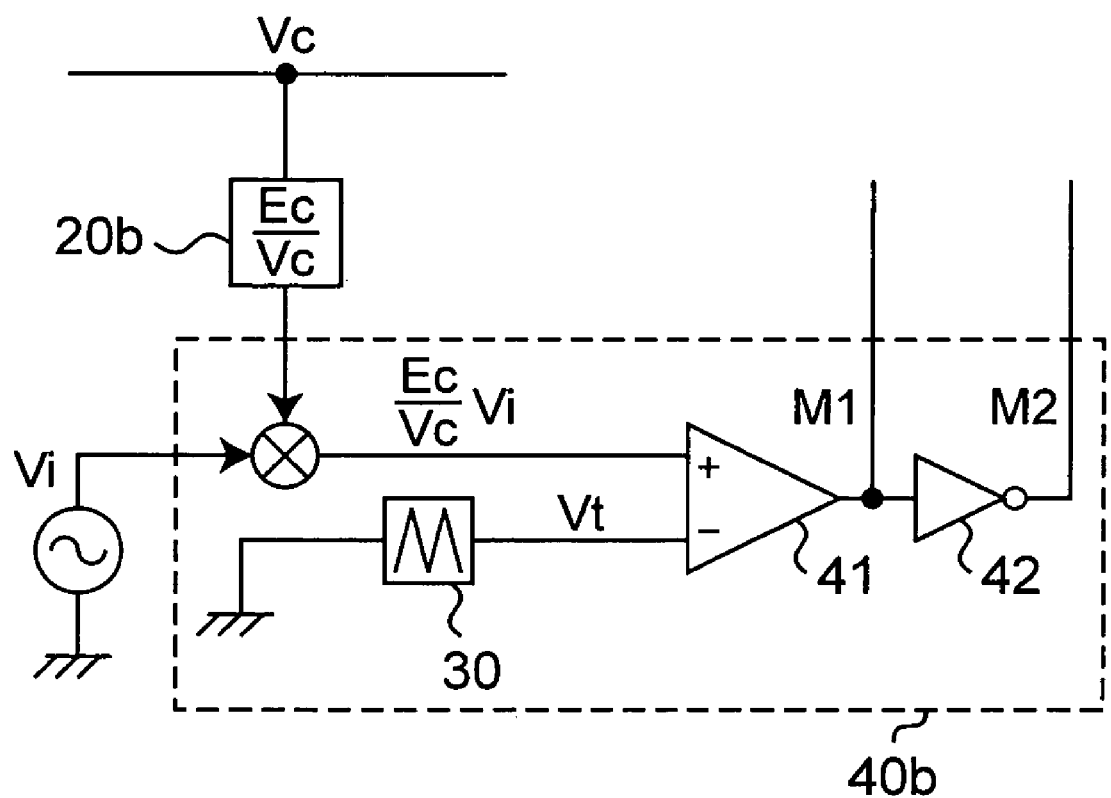
FIG. 5 is a circuit diagram of another example of an arithmetic circuit in the power amplifying apparatus according to the present invention.

According to the above equation, it can be understood that the gain can be controlled by the DC component Ec of the power supply voltage Vc while removing a variation of the power supply voltage Vc from the output AC signal Vo. FIG. 5 shows a configuration used to multiplying the input signal Vi by the ratio (Ec/Vc). In FIG. 5, an arithmetic circuit 20$b$ is designed to detect the DC component Ec of the power supply voltage Vc and multiply the input AC signal Vi by the ratio (Ec/Vc) of the power supply voltage Vc and the DC component Ec.

In the above embodiments, the applications of the present invention to power amplifying apparatuses having a BTL system or an H-shaped bridge configuration are described. However, the present invention can also be applied to configurations other than the above configurations.

For example, the present invention can also be applied to a configuration including a switch circuit having only a series circuit of a pair of high-side switch and low-side switch, and a load unit connected to an intermediate portion between the switches.

When the duty ratio of the high-side switch is represented by δ, a voltage Vx generated by the load unit is expressed by the following equation.

$$Vx=\delta \cdot Vc$$

On the other hand, the duty ratio δ is expressed using the input AC signal Vi and the amplitude Vtc of the triangular wave voltage Vt as follows.

$$\delta=(1+Vi/Vtc)/2$$

In this case, when the idea of the present invention is applied, the amplitude Vtc of the triangular wave voltage Vt is equal to a value obtained by multiplying a ratio (Vc/Ec) of the power supply voltage Vc and a DC component Ec thereof by a predetermined voltage Et. Therefore, the amplitude Vtc is expressed by the following equation.

$$Vtc=(Vc/Ec) \cdot Et$$

From the above, the voltage Vx is expressed by the following equation.

$$Vx=Vc/2+(Ec/Et) \cdot Vi/2$$

When the voltage Vc/2 which is a half of the power supply voltage Vc is subtracted from the voltage Vx, as an output AC signal Vo, a voltage obtained by amplifying an input AC signal Vi, $\{(Ec/Et)/2\}$ times is obtained as follows.

$$Vo=(Ec/Et) \cdot Vi/2$$

According to the above equation, varying the DC component Ec in the power supply voltage Vc can control the gain. In addition, even though the power supply voltage Vc alternately varies, the gain is not affected, and the output AC signal Vo is not distorted.

In this manner, the present invention is not limited to a BTL system including two pairs of switch circuits, but can also be applied to a power amplifying apparatus including only one pair of switch circuits.

Furthermore, the present invention can be applied to all power amplifying apparatuses each having a switch circuit including a series circuit of a high-side switch and a low-side switch and a D-class amplifying function provided by applying a power supply voltage intermittently or pulse-wise to a load through the switches to vary the gain in proportion to the power supply voltage. More specifically, the present invention can be applied to not only the case in which an analog input signal is modulated in pulse width by using a triangular wave as described in the above embodiments, but also to a case in which pulse density modulation or pulse width modulation of an input signal which is an analog signal or a digital signal, is performed by a sigma-delta modulator or the like.

The present invention has been described with reference to the specific embodiments. However, a large number of other modifications and changes and other usages are apparent to a person skilled in the art. Therefore, the present invention is not limited to the specific disclosure described above, and can be limited to only the accompanying claims. The application is related to a Japanese patent application No. 2002-331898 (filed on Nov. 15, 2002), the contents of which are incorporated herein by reference.

INDUSTRIAL APPLICABILITY

A power amplifying apparatus according to the present invention is useful to a power amplifying apparatus that amplifies a power of an audio signal or the like to supply the amplified audio signal to an acoustic speaker or the like.

The invention claimed is:

1. A power amplifying apparatus comprising:
   a switch unit that is supplied with a power supply voltage Vc and includes a series circuit of a high-side switch and a low-side switch; and
   a control unit that operates the switch unit in accordance with the input AC signal Vi in a cycle with a predetermined ratio of ON and OFF periods to drive a load connected to a connection point between the high-side switch and the low-side switch, the control unit including:
a pulse modulation unit that receives the input AC signal Vi, generates a pulse signal from the input AC signal Vi at a predetermined modulation sensitivity, and outputs the pulse signal;
an arithmetic unit that detects a DC voltage component (Ec) from the power supply voltage Vc, and that multiplies the modulation sensitivity by a ratio (Vc/Ec) of the power supply voltage (Vc) to the DC component (Ec) or multiplies the input AC signal Vi by a ratio (Ec/Vc) of the DC component (Ec) to the power supply voltage (Vc); and
a drive unit that drives the switch unit on the basis of the pulse signal.

2. The power amplifying apparatus according to claim 1, wherein the switch unit has a full bridge configuration which has two series circuits connected in parallel, each of series circuits includes high-side switch and a low-side switch, and the load is connected between the connection points between the high-side switches and the low-side switches in the series circuits.

3. The power amplifying apparatus according to claim 1, further comprising a stabilizing power supply unit that can control the DC voltage component, the power supply voltage being supplied from the stabilizing power supply unit.

4. The power amplifying apparatus according to claim 3, wherein the stabilizing power supply unit has a function that controls the DC component of the power supply voltage to control a signal gain which is a ratio of the input AC signal Vi to the output AC signal Vo.

5. The power amplifying apparatus according to claim 4, wherein
the arithmetic unit has a series circuit of a plurality of resistors including a variable resistor that is substantially connected to both terminals of the switch unit, and a low-pass filter connected to a first connection point between the resistors arranged on a lower potential side than the variable resistor,
the pulse modulation unit has a triangular wave voltage generation circuit, the triangular wave voltage generation circuit receiving a potential of a second connection point arranged on the lower potential side of the variable resistor and the potential of the first connection point, and generates a triangular wave voltage having an amplitude equal to a potential difference between the first connection point and the second connection point, and compares the triangular wave voltage with the input AC signal to generate a pulse signal, and
the stabilizing power supply unit controls an output voltage of the low-pass filter to control the DC component Ec of the power supply voltage.

6. The power amplifying apparatus according to claim 1, wherein
the arithmetic unit multiplies a predetermined voltage by the ratio (Vc/Ec) to output the voltage, and
the pulse modulation unit has a triangular wave voltage generation circuit that generates a triangular wave voltage Vt having an amplitude equal to an output voltage from the arithmetic unit, and compares the triangular wave voltage Vt with the input AC signal Vi to generate the pulse signal.

7. The power amplifying apparatus according to claim 6, wherein
the arithmetic unit has
a first current source circuit that generates a first current depending on the power supply voltage Vc,
a second current source circuit that generates a second current obtained from the first current through a low-pass filter,
a constant current source circuit that supplies a predetermined current,
a first transistor in which the first current flows as a collector current;
a second transistor in which the second current flows as a collector current,
a third transistor in which the predetermined current flows as a collector current, and
a fourth transistor, and
the first transistor and the third transistor are connected to each other such that the respective base-emitter voltages are added to each other,
the second transistor and the fourth transistor are connected to each other such that the respective base-emitter voltages are added to each other,
the respective transistors are connected such that both the added voltages are equal to each other, thereby outputting a voltage depending on a collector current flowing in the fourth transistor.

8. A power amplifying apparatus wherein a switch is driven by a pulse signal generated by modulating an input AC current signal at a modulation sensitivity multiplied by the ratio (Vc/Ec) of a power supply voltage Vc to a DC voltage component Ec of the supplied power supply voltage Vc.

9. The power amplifying apparatus according to claim 8, wherein the switch is driven by a pulse signal which depends on a comparison result of the input AC signal and a triangular wave voltage, and the amplitude of the triangular wave voltage is equal to a voltage obtained by multiplying the ratio (Vc/Ec) of the power supply voltage Vc to the DC voltage component Ec of the power supply voltage Vc by a predetermined voltage.

10. A power amplifying apparatus, wherein a switch is driven by a pulse signal which depends on an input AC signal multiplied by a ratio (Ec/Vc) of a DC voltage component Ec of a power supply voltage Vc to the supplied power supply voltage Vc.

* * * * *